US006281823B1

(12) United States Patent
Gross, Jr. et al.

(10) Patent No.: US 6,281,823 B1
(45) Date of Patent: Aug. 28, 2001

(54) DIRECT DIGITAL SYNTHESIS USING A SINE WEIGHTED DAC

(75) Inventors: George F. Gross, Jr., Fleetwood; Carl R. Stevenson, Macungie, both of PA (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/400,302

(22) Filed: Sep. 21, 1999

(51) Int. Cl.[7] ..................... H03M 1/66
(52) U.S. Cl. ..................... 341/144; 331/23
(58) Field of Search ..................... 341/143, 144; 331/23, 18

(56) References Cited

U.S. PATENT DOCUMENTS

| | | | | |
|---|---|---|---|---|
| 4,757,519 | * | 7/1988 | Collision et al. | 375/60 |
| 5,184,092 | * | 2/1993 | Shahriary | 331/16 |
| 5,563,535 | * | 10/1996 | Corry et al. | 327/105 |

OTHER PUBLICATIONS

Ertl et al. Increasing the Frequency Resolution of NCO–systems Using a Circuit Based on a Digital Adder, IEEE Transactions on Circuits and Systems, vol. 43 No.3, Mar. 1996.*

* cited by examiner

*Primary Examiner*—Peguy Jeanpierre
(74) *Attorney, Agent, or Firm*—William H. Bollman

(57) ABSTRACT

The present invention provides a novel direct digital synthesis system architecture which employs a numerically-controlled oscillator (NCO), some decoding logic, and a sine-weighted digital-to-analog converter (DAC) with significantly fewer output values required than conventional DDS systems to provide improved spurious performance (relative to the number of bits of resolution required of the DAC), extended frequency of operation, reduced chip area, and reduced power consumption relative to conventional DDS techniques. The output of the decoder is input to a sine-weighted digital-to-analog converter (DAC). Importantly, the sine-weighted DAC outputs a constant number of samples per cycle using a relatively few number of taps. Although there are significantly fewer taps in the sine-weighted DAC as compared to the linear DAC in conventional DDS systems, each tap of the sine-weighted DAC has a high degree of accuracy, e.g., 16–18 bits. Accordingly, a constant number of sample values are repetitively used in the stepped approximation of a sine wave, regardless of output frequency, significantly reducing the number of discrete output values that a digital-to-analog converter (DAC) is otherwise required to produce. Unlike conventional direct digital synthesis (DDS) architectures which use linear digital-to-analog converters having many bits of resolution, the present invention provides a sine-weighted digital-to-analog converter having relatively few taps to produce a constant number of samples per cycle, eliminating the conventional need for a memory-based sine wave look-up table.

19 Claims, 19 Drawing Sheets

DDS with constant number of sine-weighted samples per cycle to improve performance, simplify decoder design, and simplify the design of the DAC DDS with constant number of sine-weighted samples per cycle to improve performance, simplify decoder design, and simplify the design of the DAC Alternate Architecture for DDS with constant number of sine-weighted samples per cycle to improve performance, simplify decoder design, and simplify the design of the DAC Conventional DDS Architecture

DIRECT DIGITAL SYNTHESIS USING A SINE WEIGHTED DAC

BACKGROUND OF THE INVENTION

1. Field of the Invention

This invention relates generally to direct digital synthesizers. More particularly, it relates to a direct digital synthesizer having improved spurious performance extending a frequency of operation, reducing chip area, and reducing power consumption, relative to conventional direct digital synthesizer techniques.

2. Background of Related Art

Direct digital synthesizer (DDS) techniques have been used for years in a variety of telecommunications applications, but conventional architectures require high-performance digital-analog converters (DACs) with many bits of resolution and fast settling times. These conventional designs provide adequate spurious performance for use in applications such as local oscillators, generation of frequency shift keying (FSK) or phase shift keying (PSK) modulation waveforms, etc.

For instance, direct digital synthesis (DDS) has had a dramatic impact on the "best approach" to bench-top function generators. Over the last few years, improvements in LSI logic, fast random access memories (RAM), and digital-to-analog converters (DACs) have made DDS the technology of choice for this application.

FIG. 3 shows a block diagram of a conventional direct digital synthesis system including a look-up table memory.

In particular, there are three major components to a conventional sine wave DDS: a phase accumulator 312, a sine wave look-up table 304, and a digital-to-analog converter (DAC) 302.

A numerically controlled oscillator (NCO) 310 is formed by adding a phase increment value 318 to a fed back output from a phase accumulator 312 in an adder 316. The adder is clocked with an appropriate clock 314.

The output of the NCO 310 is input as an address to a memory-based look-up table, e.g., a sine-wave look-up table 304. The value stored in the indexed address in the look-up table 304 is output to a high resolution digital-to-analog converter 302. The DAC 302 is conventionally of high resolution, e.g., of at least 10–12 bits.

The output of the DAC 302 is smoothed using an appropriate reconstruction filter 306 such as a low pass filter.

In operation, the phase accumulator 312 computes an address for the sine wave look-up table 304 (which is typically stored in memory such as RAM or ROM). The sine wave value output by the lookup table 304 is converted to an analog voltage level by the digital-to-analog converter (DAC) 302.

To generate a fixed frequency sine wave, a constant value (i.e., the phase increment value 318) is added to the output of the phase accumulator 312 with each pulse of the clock 314. If the phase increment value 318 is large, the phase accumulator 312 will step quickly through the sine look-up table 304, and correspondingly will generate a high frequency sine wave.

One might think that to generate a "clean" sine wave you would need hundreds or thousands of points in each cycle of the sine wave. In fact, you only need about three. Of course, a three step approximation to a sine wave hardly looks like a sine wave, but if the conventional DAC 302 is followed with a good low-pass filter 306, the high frequency components are removed leaving a clean sine wave.

The frequency resolution of the conventional DDS is determined by the number of bits in the phase accumulator 312 and the clock frequency. A high number of bits provides a very high resolution in the frequency, and thus the general emphasis in conventional DDS systems is for use of a high number of bits to provide high resolution. For instance, a conventional 32-bit phase accumulator would provide a frequency resolution of 1 part in $2^{32}$ (approximately 4.3 billion) relative to the master clock frequency.

The maximum output frequency obtainable from a DDS depends on the master clock frequency which controls the sequential addition of phase increment values to the previously accumulated phase value fed back from the phase accumulator. Theoretically, the maximum frequency output would be limited by the Nyquist criterion to Fclock/2. However, in practice, as the Nyquist frequency is approached and the number of samples per cycle of the output waveform decreases the spurious performance degrades to unacceptable levels. Thus conventional DDS devices are frequently used to generate frequencies up to only something on the order of ⅔ of the Nyquist frequency.

Many applications require hopping rapidly between various sine wave frequencies. To allow for agile modulation of the frequency and/or phase of the output signal, it is relatively common to provide for a pair or more of registers which can be pre-loaded with different phase increment values and selectively multiplexed into the phase increment input of the DDS' adder/phase accumulator.

The adder/phase accumulator/sine (or cosine) lookup table functions could also be implemented as a software algorithm running on a fast microprocessor or digital signal processor, but generally such functions are realized in dedicated digital logic in the interest of obtaining the fastest possible operation and thus higher operating frequencies.

The phase accumulator 312 in conventional DDS systems typically includes a rather large number of bits (e.g., 24 to 32) to provide a fine resolution in frequency. However, it is common practice to truncate this value to a smaller and more manageable number of bits, N, by using only the N most significant bits of the output of the phase accumulator 312 in a stage following the phase accumulator 312, e.g., at the input to the look-up table 304. Generally, these N most significant bits output by the phase accumulator 312 are used as an address into the look-up table 304. The look-up table 304 is a sine wave look-up table containing sine wave values in appropriate address locations corresponding to the desired value of the instantaneous phase which has been accumulated. The sine-valued outputs of the look-up table 304 are often further truncated to a resolution of something on the order of 10 or 12 bits, since it is increasingly difficult to produce a linear DAC 302 with both higher resolution and adequate settling time for high frequency operation.

This architecture results in a stepped approximation to a sine wave signal output from the digital-to-analog converter (DAC) 302, the stepped approximation improving with additional resolution (i.e., bits). However, even though a design may allow for a large number of steps per cycle of the output frequency at low frequencies, as the Nyquist frequency is approached the steps per cycle nevertheless reduces to very few steps per cycle of the output frequency. The result is that the spurious performance of a conventional DDS generally degrades as the output frequency increases towards the Nyquist limit. Thus, the usable output frequency of a conventional DDS is considerably less than its Nyquist frequency.

Moreover, the need for a DDS with high resolution and minimal spurious performance requires the digital-to-analog converter 302 to be capable of resolving a large number of discrete output levels. This drives the need for larger numbers of bits of resolution, which in turn requires a digital-to-analog converter (DAC) 302 with a correspondingly large number of taps in its resistor string. Unfortunately, each additional tap in the DAC 302 increases its parasitic capacitance rapidly and significantly, making it increasingly difficult to achieve the fast settling times necessary to meet today's high frequency operation requirements. Of course, this refers strictly to a resistor string type DAC. Other architectures are possible, e.g., switched capacitors. Nevertheless, in general, as the resolution of the DAC increases, area and power dissipation increase, and speed decreases.

There is thus a need for a direct digital synthesis (DDS) technique and apparatus which has improved spurious performance even at higher frequencies of operation.

SUMMARY OF THE INVENTION

A direct digital synthesizer in accordance with the principles of the present invention comprises a numerically controlled oscillator adapted to output a constant number of sine-weighted samples per cycle of frequency output, and a sine-weighted digital-to-analog converter receiving an output from the numerically controlled oscillator.

A method of synthesizing a sine-wave signal in accordance with another aspect of the present invention comprises generating a numerically controlled oscillator output having a constant number of samples per cycle of a desired frequency generated, and digitally converting the constant number of samples using a sine-weighted digital-to-analog converter.

BRIEF DESCRIPTION OF THE DRAWINGS

Features and advantages of the present invention will become apparent to those skilled in the art from the following description with reference to the drawings, in which.

DETAILED DESCRIPTION OF ILLUSTRATIVE EMBODIMENTS

Figure 1:
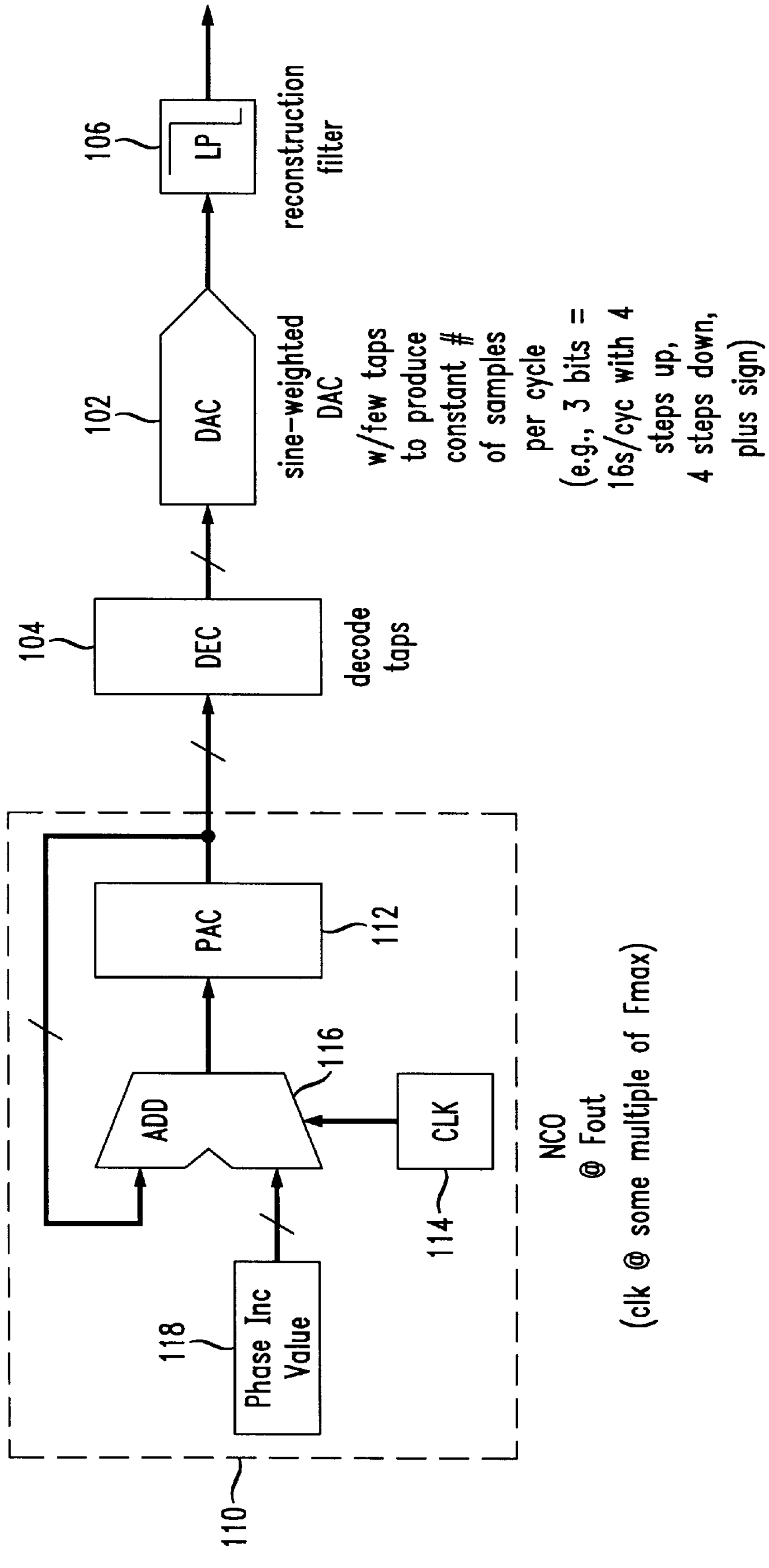
FIG. 1 shows a block diagram of a first embodiment of a direct digital synthesis system having a constant number of sine-weighted samples per cycle to improve spurious performance, simplify decoder design, and simplify digital-to-analog converter design, in accordance with the principles of the present invention.

The present invention provides a novel direct digital synthesis system architecture which employs a numerically-controlled oscillator (NCO), some decoding logic, and a sine-weighted resistor string-based digital-to-analog converter (DAC) with significantly fewer analog outputs available than conventional DDS systems to provide improved spurious performance (relative to the number of bits of resolution required of the DAC), extended frequency of operation, reduced chip area, and reduced power consumption relative to conventional DDS techniques. One skilled in the art could apply these same principles to other sine-weighted DAC architectures within the principles of the present invention.

The architecture outlined herein substantially avoids these limitations by employing a constant number of steps per cycle in the stepped approximation of the output sine wave generated by the DAC. This is achieved by using a numerically-controlled oscillator (a clocked adder/phase accumulator), followed by decoder logic which detects the phase accumulator states corresponding to a relatively small number of distinct, equally spaced (in degrees of phase) phase states representing a constant number of sample points equally spaced (in degrees of phase) across each cycle of the desired output sine wave.

These decoded states control the sine-weighted DAC to produce a series of analog values corresponding to the value of those equally spaced (in degrees of phase) sample points on the desired sine wave output.

By varying the phase increment value input to the numerically-controlled oscillator (a clocked adder/phase accumulator), the frequency at which these sample points are generated can be varied in a controlled fashion, resulting in the ability to synthesize a variable frequency output with a constant number of samples per cycle of the desired output frequency.

In fact, regardless of the output frequency being synthesized, the same fixed set of sample values is used repetitively in the present invention, thus reducing the required number of discrete analog values which the DAC must be able to represent compared to the conventional DDS architecture, where the DAC must be able to represent virtually arbitrary points on the output sine wave for each sample as the frequency of operation, and thus the number of samples per cycle of the output waveform, is varied.

This principle is important to the simplification of the DAC structure, which in turn allows chip area, power consumption, and the settling time performance of the DAC to be improved.

Furthermore, since the simpler sine-weighted DAC of the present invention can represent the fixed set of sample points of the present invention to a higher precision than the conventional DDS' typical 10–12 bit linear DAC can represent the constantly varying sample point values of the conventional DDS architecture, spurious performance can simultaneously be improved through the use of the present invention.

The output of the sine-weighted DAC 102 is smoothed with a reconstruction filter 106, e.g., a low pass filter.

Figure 3:
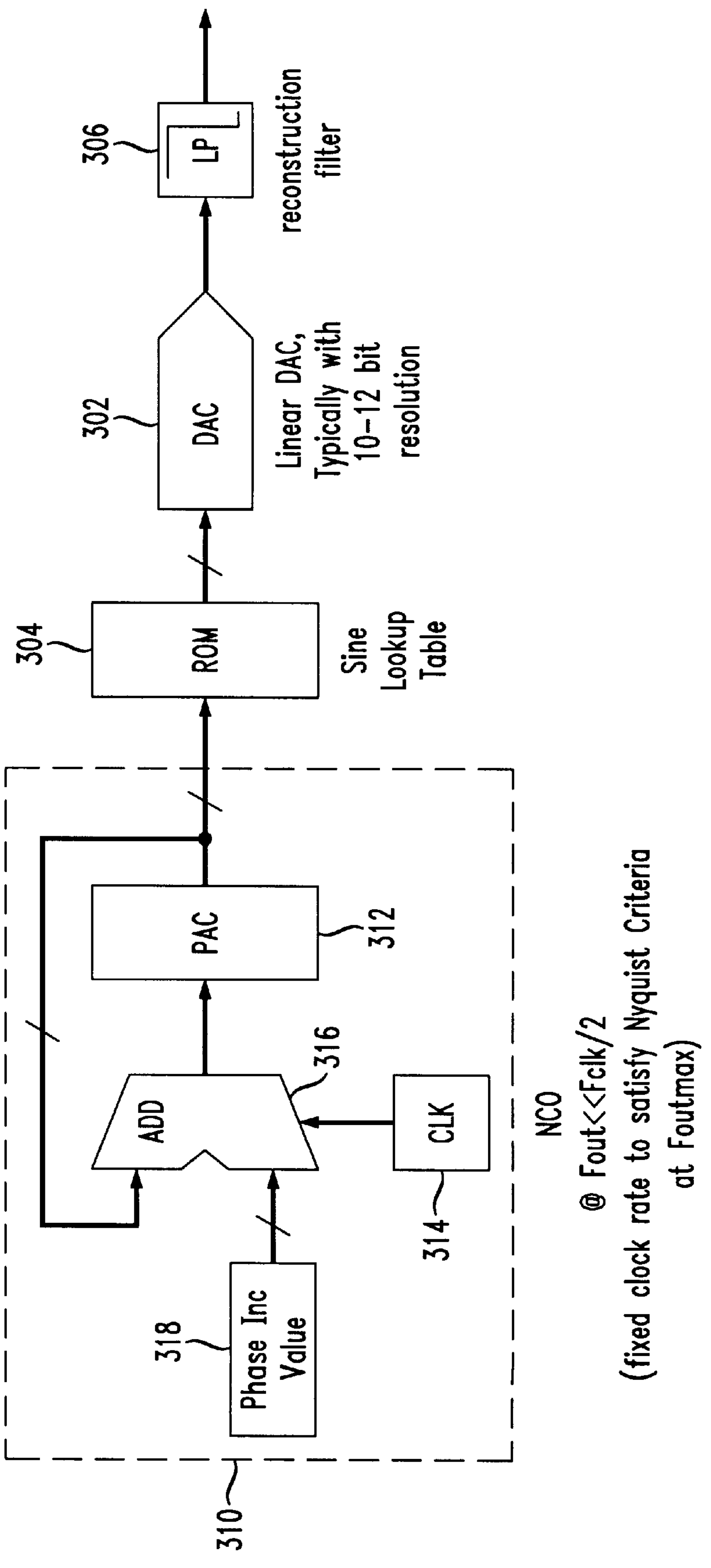
FIG. 3 PRIOR ART
FIG. 3 shows a block diagram of a conventional direct digital synthesis system including a look-up table memory.

The disclosed architecture employs a constant number of samples in the stepped approximation of a sine wave, regardless of output frequency, significantly reducing the number of discrete output values that a digital-to-analog converter (DAC) is otherwise required to produce. In the disclosed embodiment, the digital-to-analog converter 102 is a sine-weighted DAC (as opposed to a linear DAC 302 (FIG. 3) as in conventional DDS systems), eliminating the conventional need for a memory-based sine wave look-up table 304 (FIG. 3). Unlike conventional direct digital synthesis (DDS) architectures which use linear digital-to-analog converters 302 having many bits of resolution, the present invention provides a sine-weighted digital-to-analog converter 102 having relatively few analog outputs available to repetitively produce a constant number of samples per cycle.

Although there are significantly fewer analog outputs available in the sine-weighted DAC 102 as compared to the linear DAC 302 in conventional DDS systems, each available output of the sine-weighted DAC has a high degree of accuracy, e.g., 16–18 bits. This obtains a given level of spurious performance, even as the DDS output frequency approaches what, for a conventional DDS, would be the Nyquist frequency. This in turn significantly reduces the number of discrete outputs required from the DAC 102, and a reduced number of outputs provides less parasitic capacitance. The lower capacitance and therefore faster settling time results in a tremendous increase in the speed of the DAC 102. It also simplifies the decoder logic necessary to generate the required output values, thereby reducing chip area and complexity and allowing operation at higher frequencies with lower power consumption.

In the disclosed embodiment, a 3 bit resistor string type digital-to-analog converter 102 was used. However, although 3 bits are preferred, more or less bits can be implemented within the principles of the present invention with the understanding that additional taps in the digital-to-analog converter 102 will slow down the DDS because of the corresponding increased capacitance. Moreover, although the digital-to-analog converter 102 is sine-weighted in the disclosed embodiment, other types of non-linear weighting may be implemented within the principles of the present invention.

While the use of a DAC 102 with fewer bits of resolution may seem at first to be at odds with improved spurious performance, it should be noted that the individual tap values in the resistor string of the DAC 102 can be controlled to an absolute accuracy on the order of 16–18 bits, which is considerably greater accuracy than the typical 10-bit linear DAC 302 in conventional DDS systems.

The key to the invention is that, since a constant number of samples per cycle of the stepped approximation to the sine wave are generated in this new architecture, the values which must be generated represent the same points on the sine wave regardless of the output frequency which is being generated. In contrast, conventional architecture requires that almost arbitrary points on the sine wave be approximated to a finite accuracy to achieve a given level of spurious performance, thus requiring more DAC taps to produce finer-grained steps. This requirement is eliminated by the use of a constant number of samples per cycle of the approximated waveform, e.g., sine wave.

Clock scaling techniques can be used when generating relatively low frequencies (relative to the maximum frequency capability of the device) to reduce power consumption further.

Figure 2:
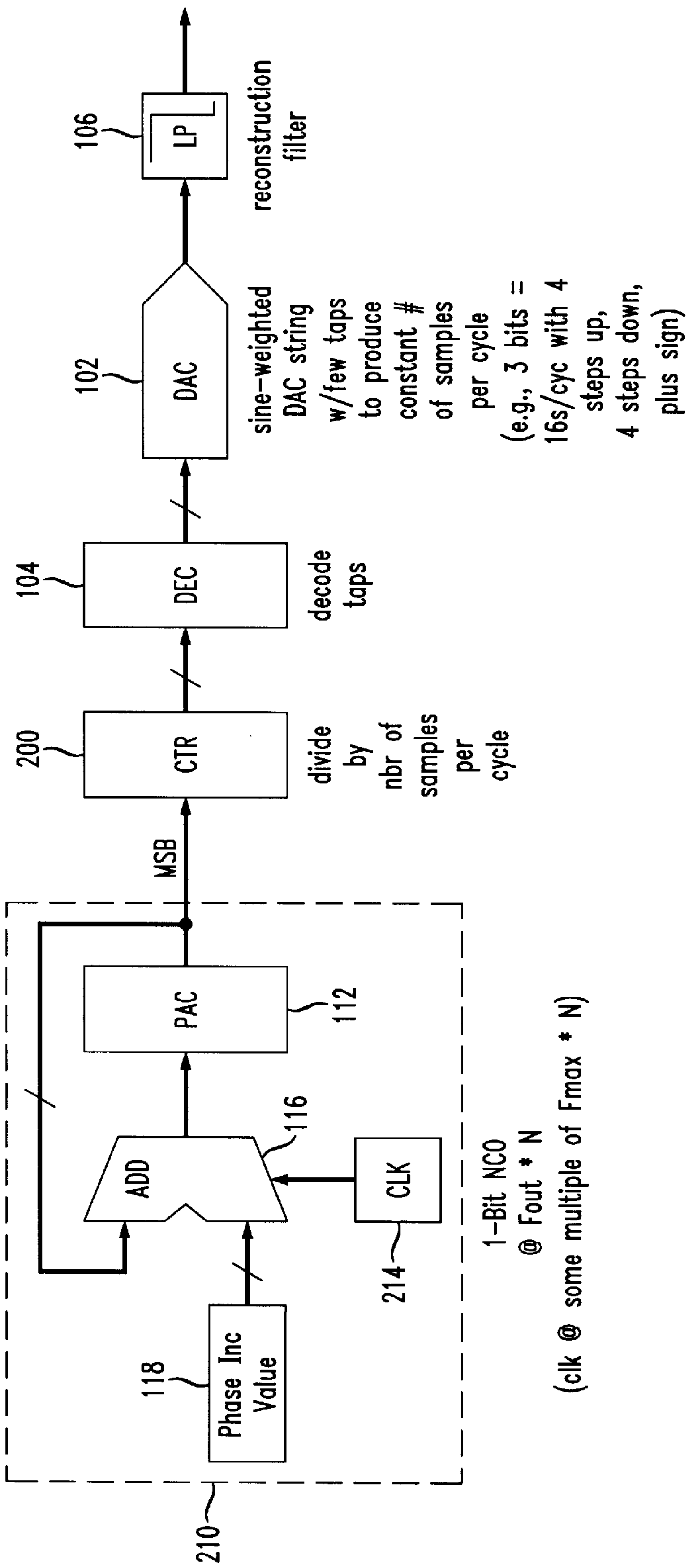
FIG. 2 shows a block diagram of a second embodiment of a direct digital synthesis system having a constant number of sine-weighted samples per cycle to improve spurious performance, simplify decoder design, and simplify digital-to-analog converter design, in accordance with the principles of the present invention.

For instance, FIG. 2 shows a block diagram of a second embodiment of a direct digital synthesis system having a constant number of sine-weighted samples per cycle to improve spurious performance, simplify decoder design, and simplify digital-to-analog converter design, in accordance with the principles of the present invention.

In particular, the DDS system includes a NCO 210, decoder 104, sine-weighted DAC 102 and reconstruction filter 106 similar to that shown and described with reference to FIG. 1. In FIG. 2 (and in FIG. 1), the clock 214 in the NCO 210 can be scaled for low frequency operation to save power, e.g., to a point sufficient to just maintain adequate oversampling for proper operation. Whereas in FIG. 1 the clock 114 was set at some multiple of the maximum frequency Fmax, the clock 214 shown in FIG. 2 is set to be at some multiple of the maximum frequency Fmax times an integer N, where N equals the number of samples per cycle of the desired output frequency.

In the example of FIG. 1, the decoder evaluates multiple bits of the phase accumulator word to control when the DAC switches to the next sequential sample point in its the fixed set of sine-weighted sample values.

In the example of FIG. 2, only the most significant bit (MSB) of the phase accumulator is employed and represents a variable frequency square wave synthesized at N times the desired output frequency. This variable frequency square wave at N times the desired output frequency clocks a divide-by-N counter, which in turn presents the decoder with an N bit word to decode to control when the DAC switches to the next sequential sample point in its the fixed set of sine-weighted sample values.

The alternate embodiment of FIG. 2 requires that the adder/phase accumulator of the NCO be clocked at a higher rate than the embodiment of FIG. 1, but could in some circumstances simplify the decoder structure in ways which could result in improved performance or reduced chip area and power consumption.

Both embodiments operate on the same principle of reducing DAC and decoder complexity and improving speed and spurious performance through the repetitive reuse of a fixed set of sample points per cycle of the desired output frequency and the selection of one of the two embodiments over the other would depend to a degree on the capabilities, limitations, and other characteristics of specific semiconductor processes (e.g., CMOS, BiCMOS, etc.) being considered for implementation.

Of course, one, many or all elements shown in FIGS. 1 and/or 2 may be separate elements, or may be combined into fewer elements. For instance, as shown in FIG. 2, the counter 200 and the decoder 104 may be combined into a single element.

Figure 4:
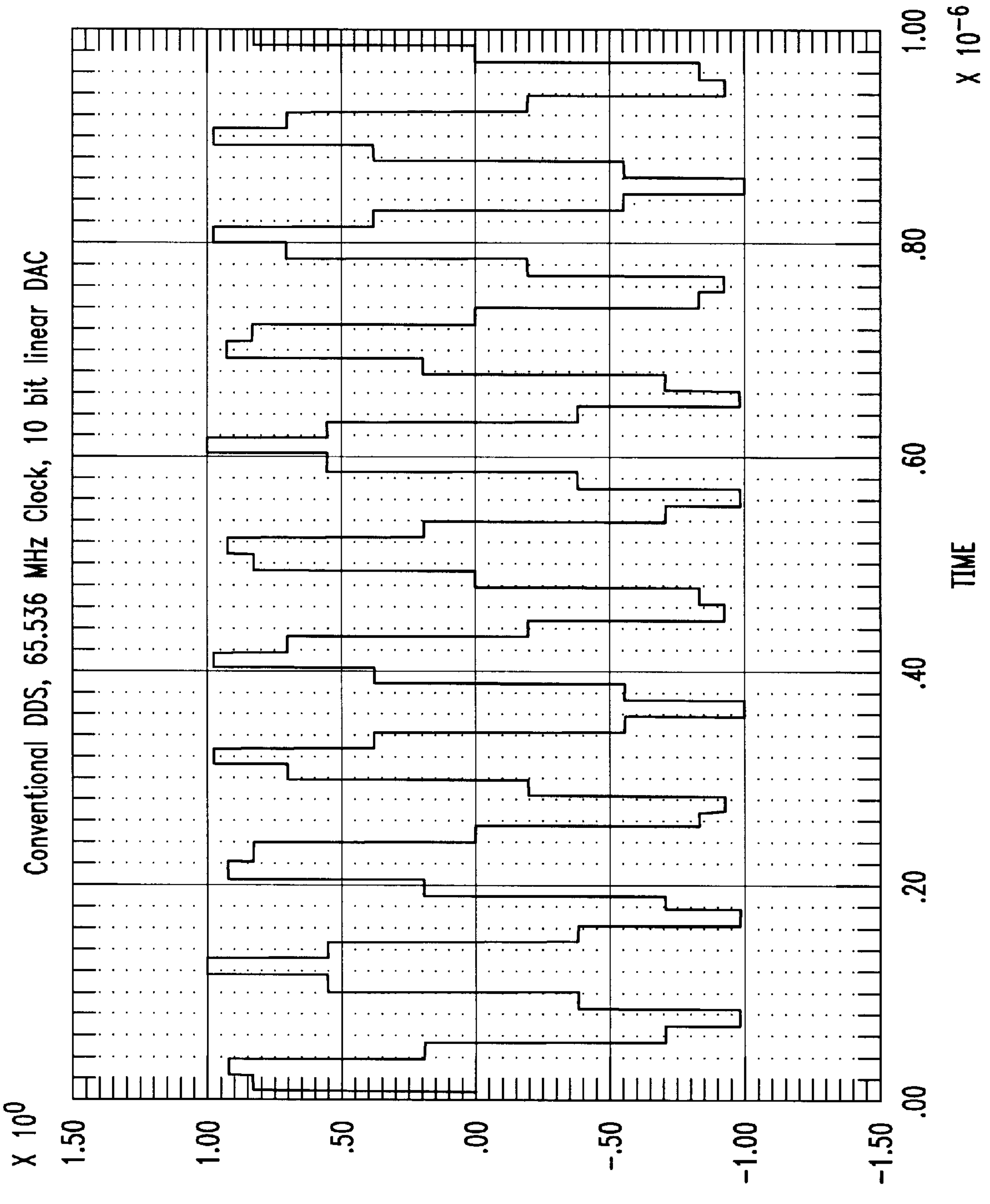
FIG. 4 PRIOR ART
FIG. 4 shows a simulation result in the time domain at the DAC output of a conventional direct digital synthesis system using a very high speed clock (e.g., 65.536 MHz) and a 10 bit linear digital-to-analog converter.
Figure 5:
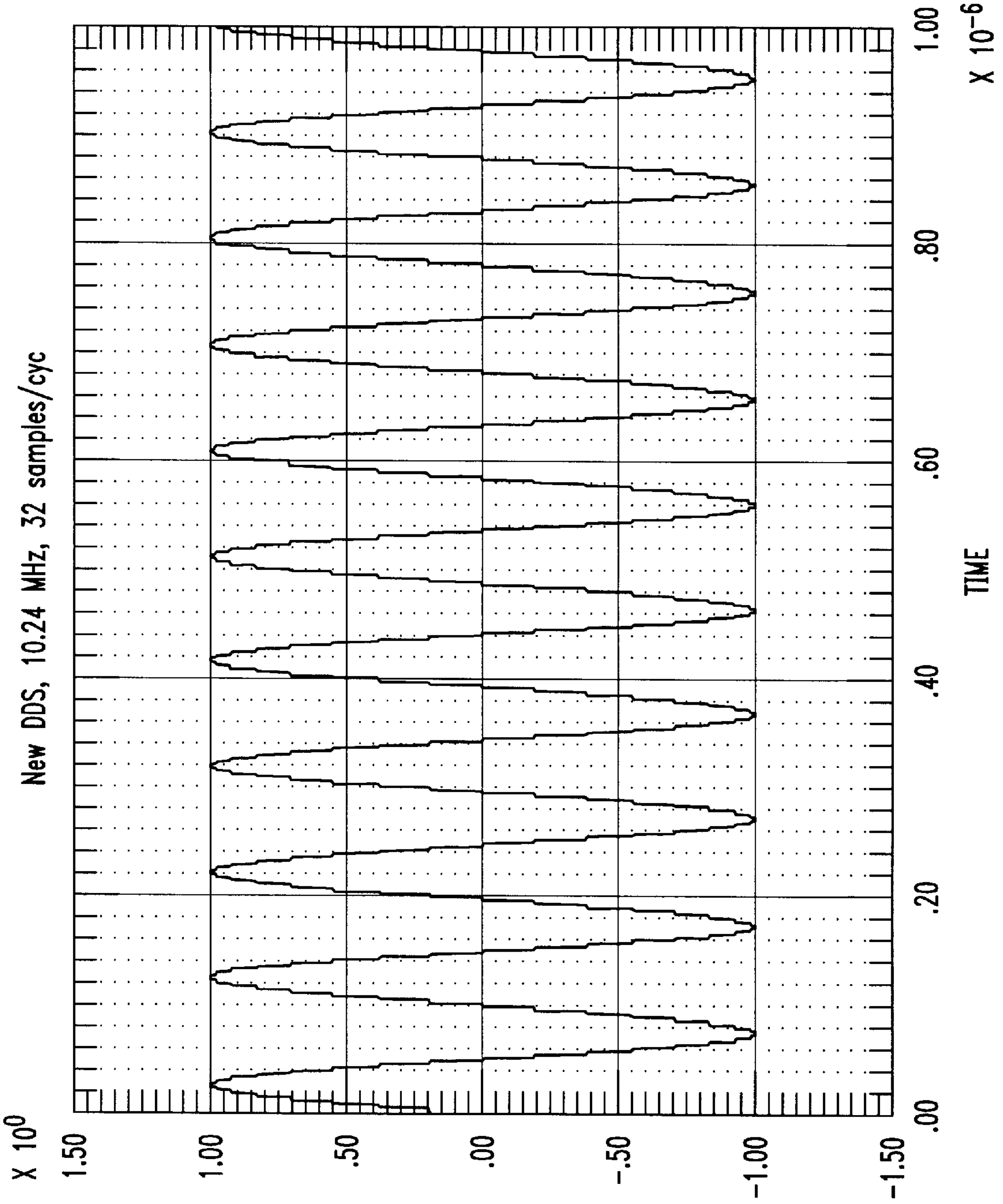
FIG. 5 shows a simulation result in the time domain at the DAC output of a direct digital synthesis system including a constant 32 samples per cycle without the need for a look-up table, in accordance with the principles of the present invention.
Figure 6:
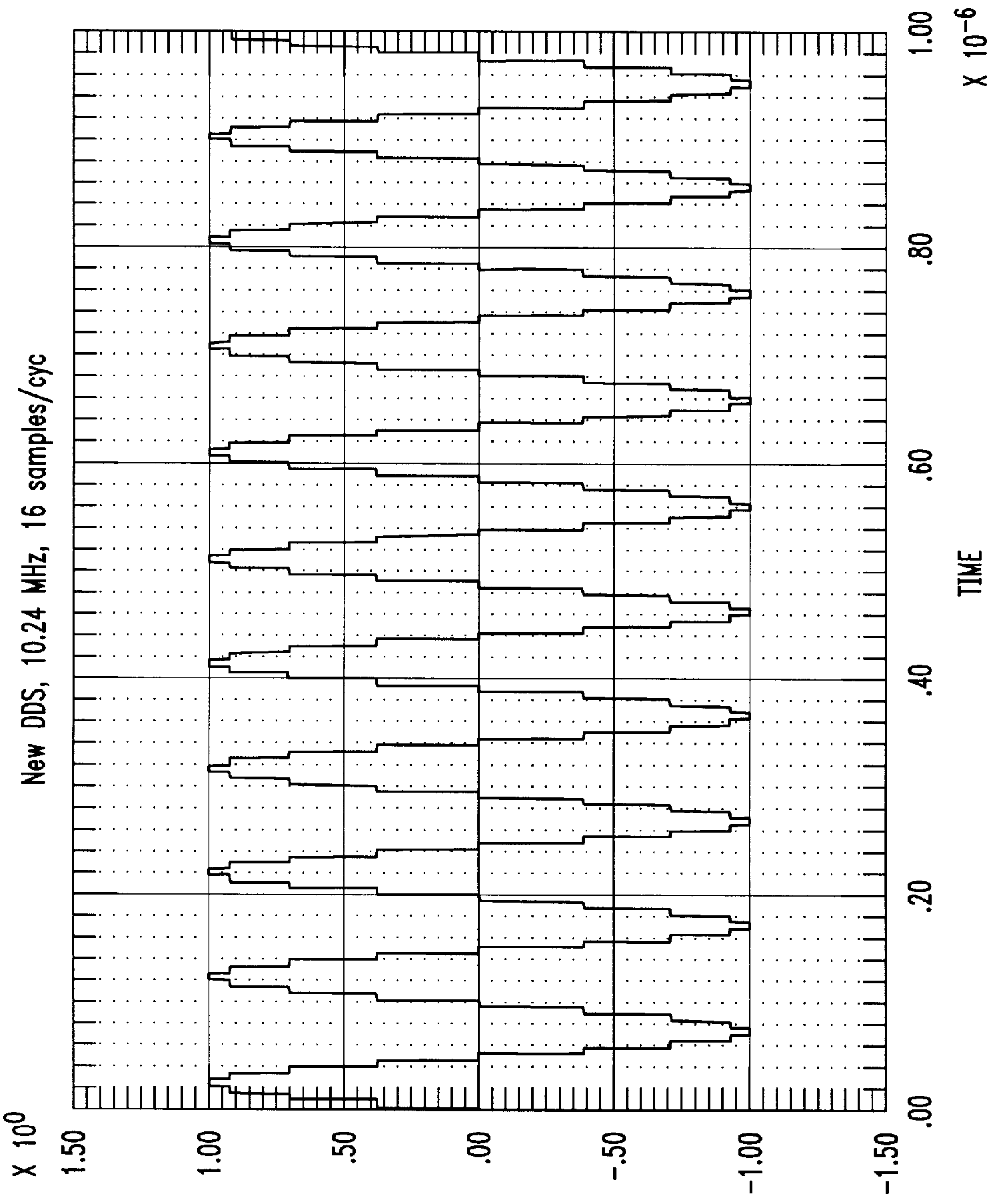
FIG. 6 shows a simulation result in the time domain at the DAC output of a direct digital synthesis system including a constant 16 samples per cycle without the need for a look-up table, in accordance with the principles of the present invention.
Figure 7:
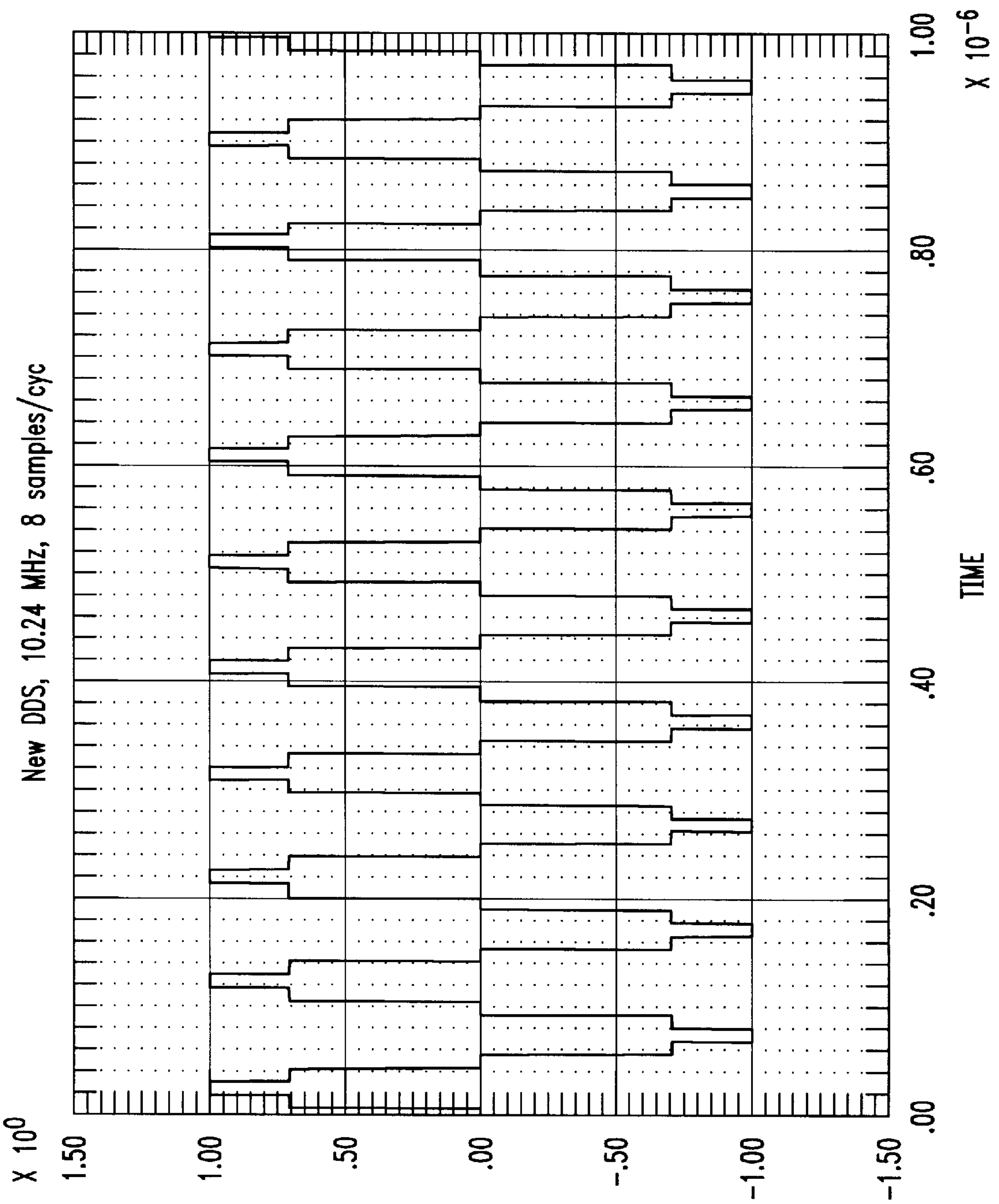
FIG. 7 shows a simulation result in the time domain at the DAC output of a direct digital synthesis system including a constant 8 samples per cycle without the need for a look-up table, in accordance with the principles of the present invention.
Figure 8:
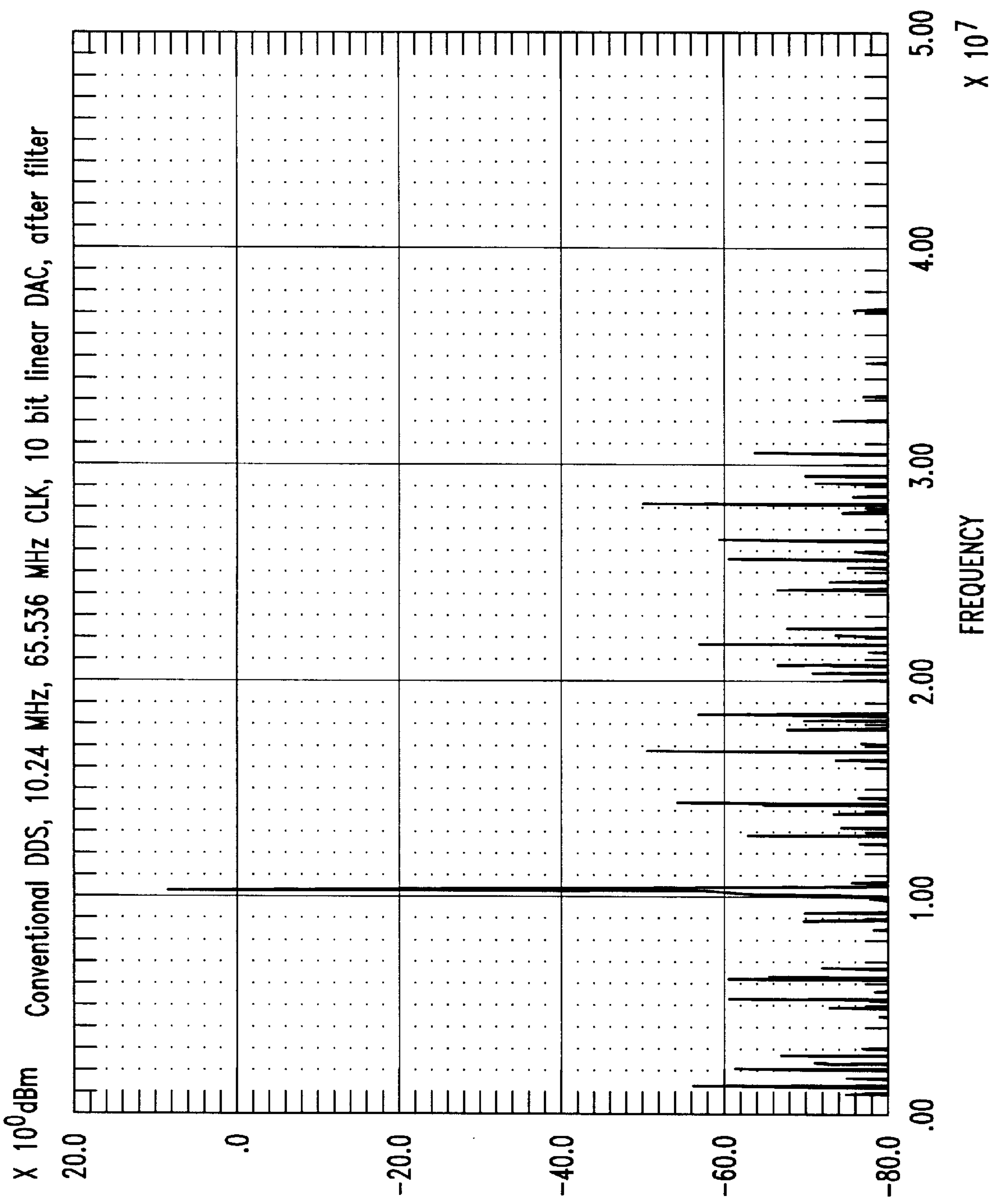
FIG. 8 PRIOR ART
FIG. 8 shows a simulation result in the frequency domain of a conventional direct digital synthesis system after a smoothing filter using a very high speed clock (e.g., 65.536 MHz) and a 10 bit linear digital-to-analog converter.
Figure 9:
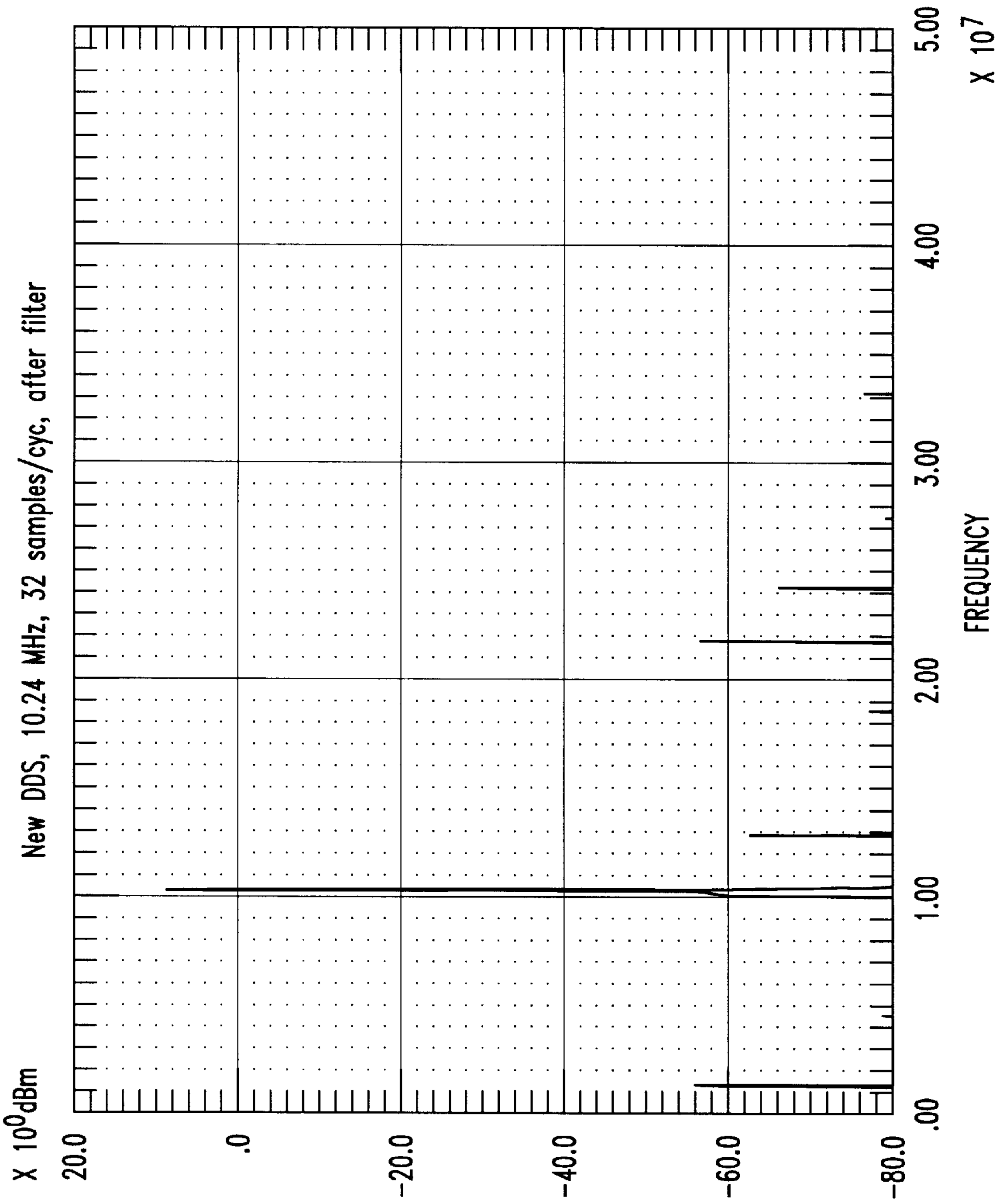
FIG. 9 shows a simulation result in the frequency domain of a direct digital synthesis system after the same smoothing filter including a constant 32 samples per cycle without the need for a look-up table, in accordance with the principles of the present invention.
Figure 10:
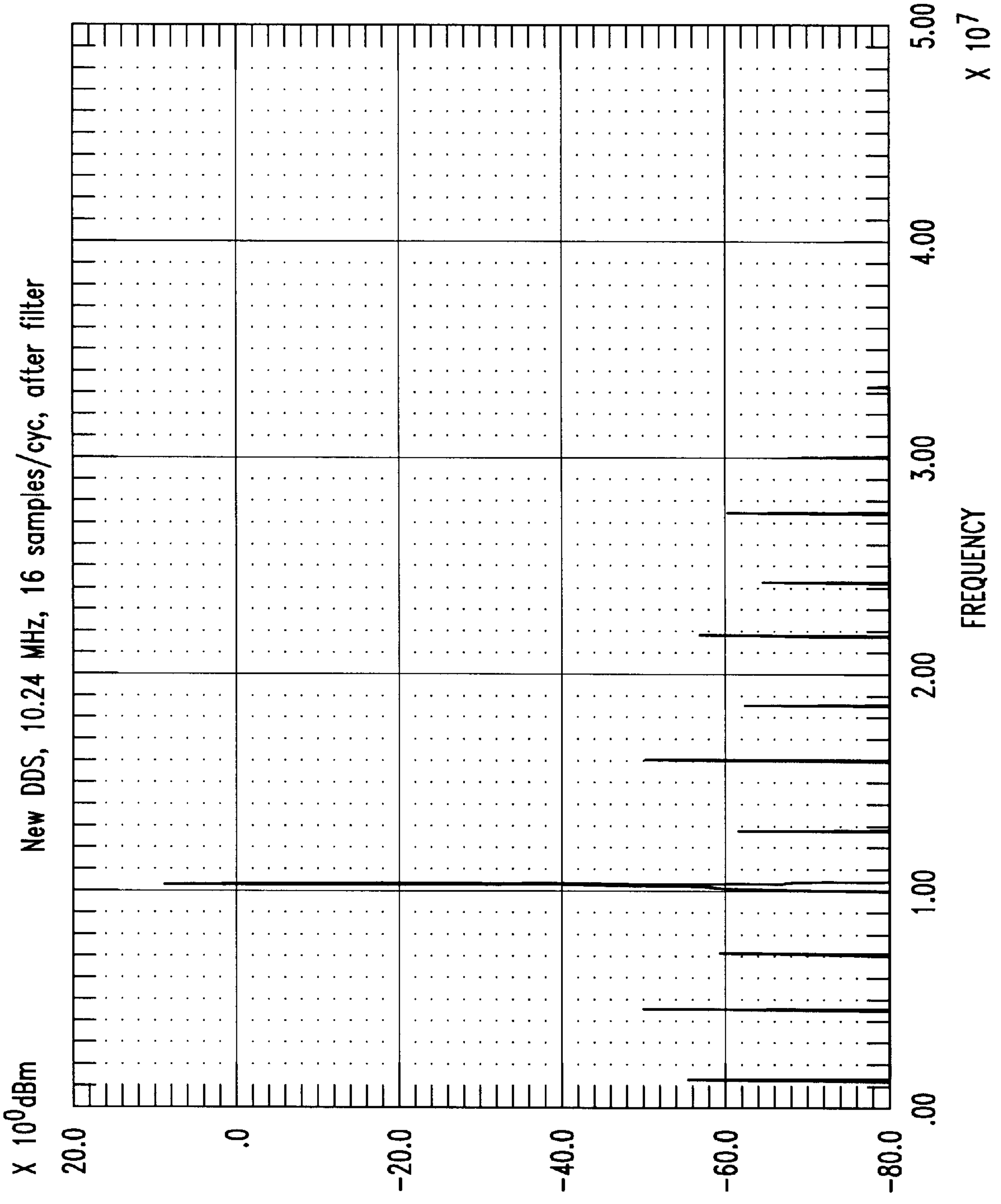
FIG. 10 shows a simulation result in the frequency domain of a direct digital synthesis system after the same smoothing filter including a constant 16 samples per cycle without the need for a look-up table, in accordance with the principles of the present invention.
Figure 11:
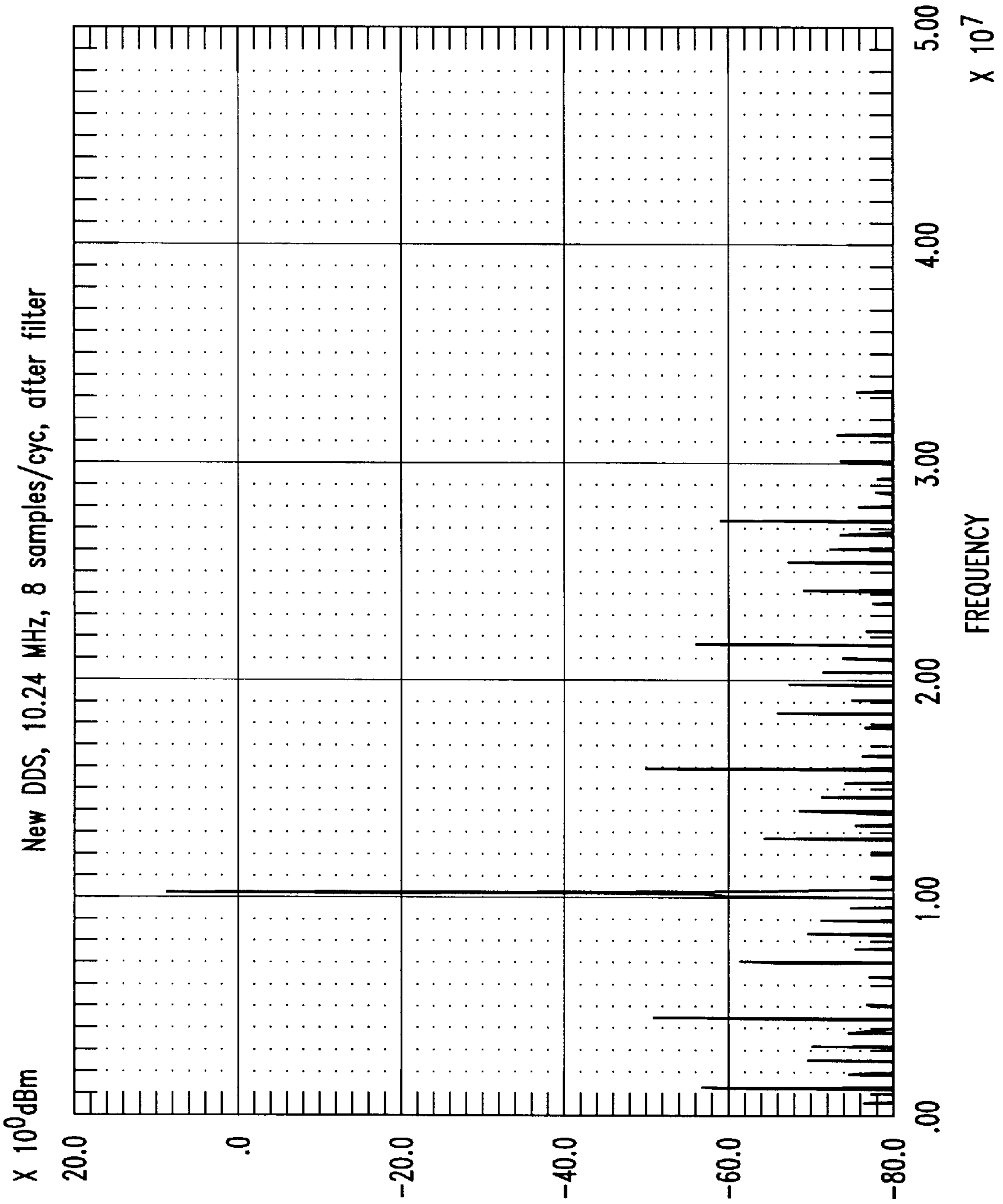
FIG. 11 shows a simulation result in the frequency domain of a direct digital synthesis system after the same smoothing filter including a constant 8 samples per cycle without the need for a look-up table, in accordance with the principles of the present invention.

FIG. 4 shows a simulation result in the time domain of the DAC output of a conventional direct digital synthesis system using a high speed clock (e.g., 65.536 MHz) and a 10 bit linear digital-to-analog converter, while FIGS. 5–7 show simulation results in the time domain of the DAC output of a direct digital synthesis system including a constant 32, 16 and 8 samples per cycle, respectively, without the need for a look-up table, in accordance with the principles of the present invention. FIGS. 8–11 show the simulation results in the frequency domain for the results shown in the time domain in FIGS. 4–7, respectively (when the same reconstruction filter was used in all cases).

Note the generation of a more consistent approximation to a sine wave signal in each of FIGS. 5, 6 and even 7 as compared to the conventionally generated waveform shown in FIG. 4.

Figure 12:
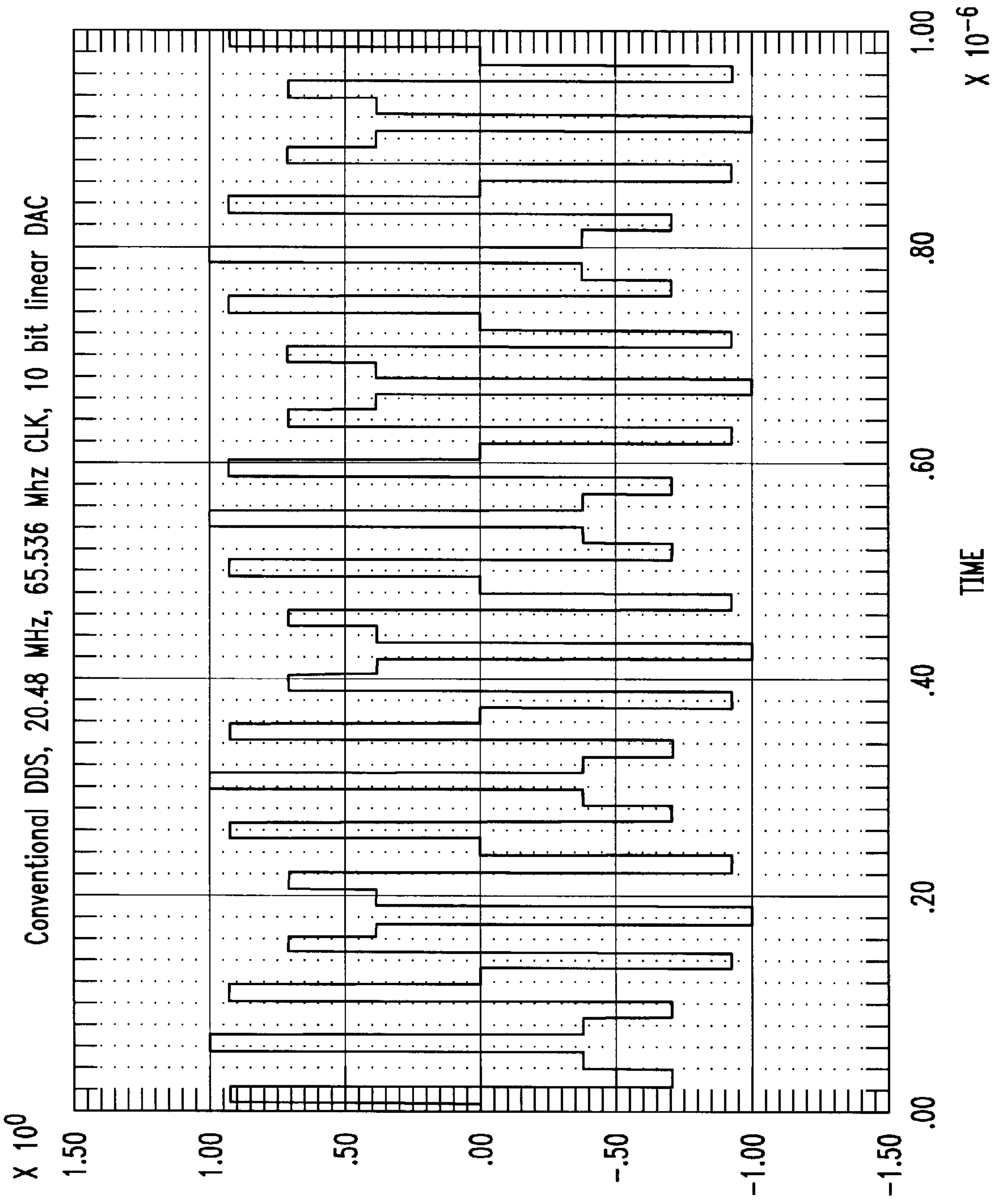
FIG. 12 PRIOR ART
FIG. 12 shows a simulation result in the time domain at the DAC output of a conventional direct digital synthesis system using a very high speed clock (e.g., 65.536 MHz) and a 10 bit linear digital-to-analog converter.
Figure 13:
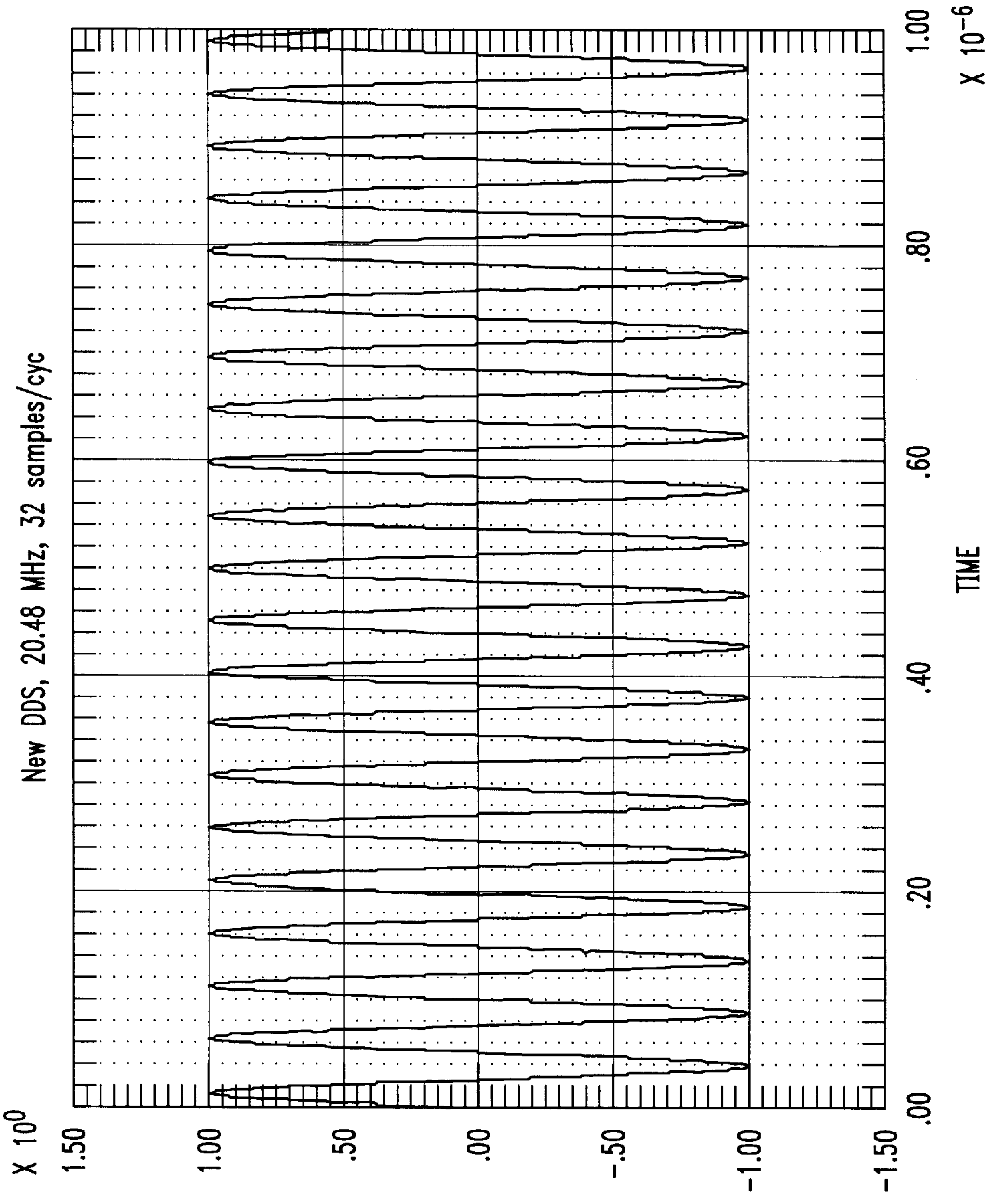
FIG. 13 shows a simulation result in the time domain at the DAC output of a direct digital synthesis system including a constant 32 samples per cycle without the need for a look-up table, in accordance with the principles of the present invention.
Figure 14:
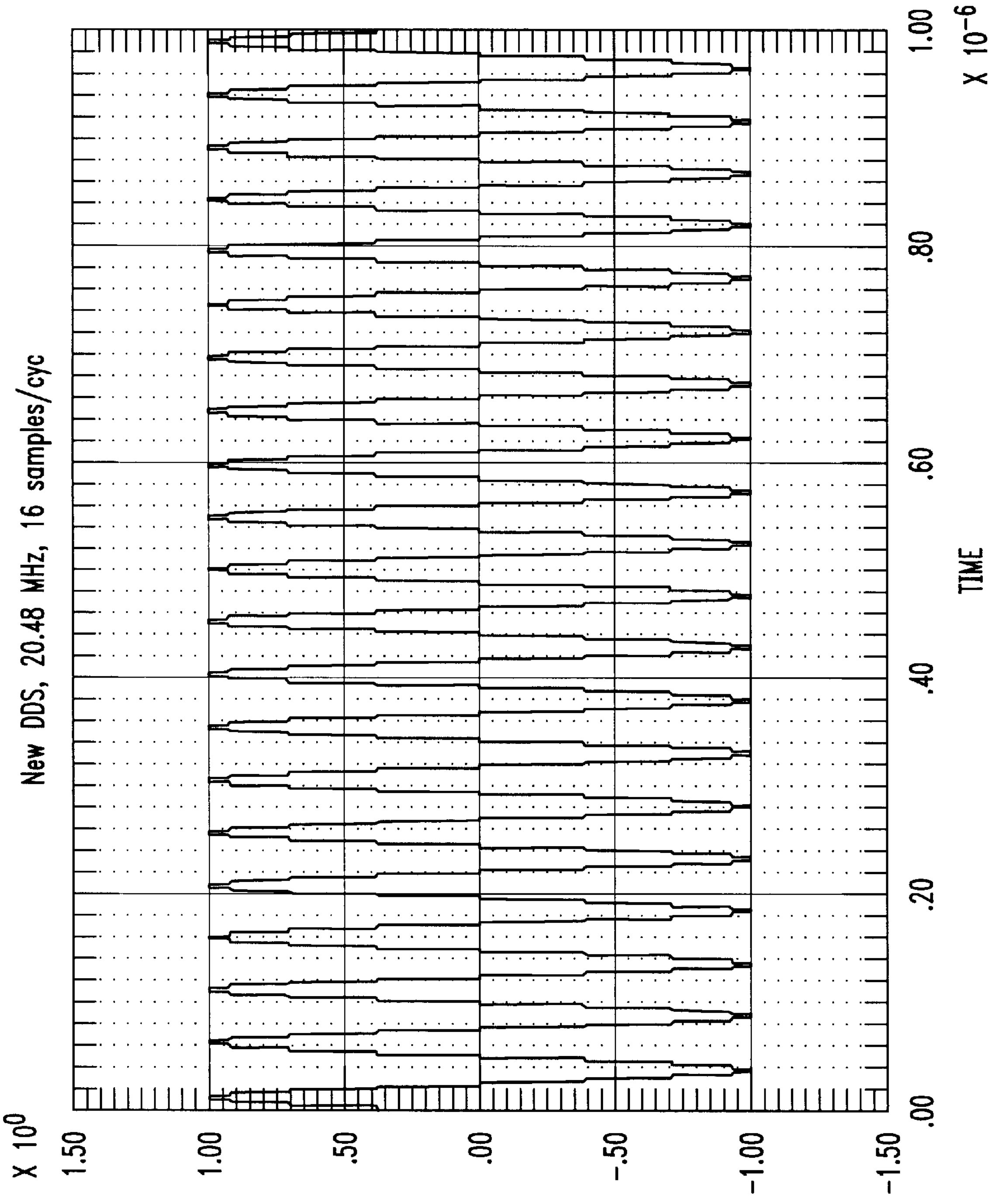
FIG. 14 shows a simulation result in the time domain at the DAC output of a direct digital synthesis system including a constant 16 samples per cycle without the need for a look-up table, in accordance with the principles of the present invention.
Figure 15:
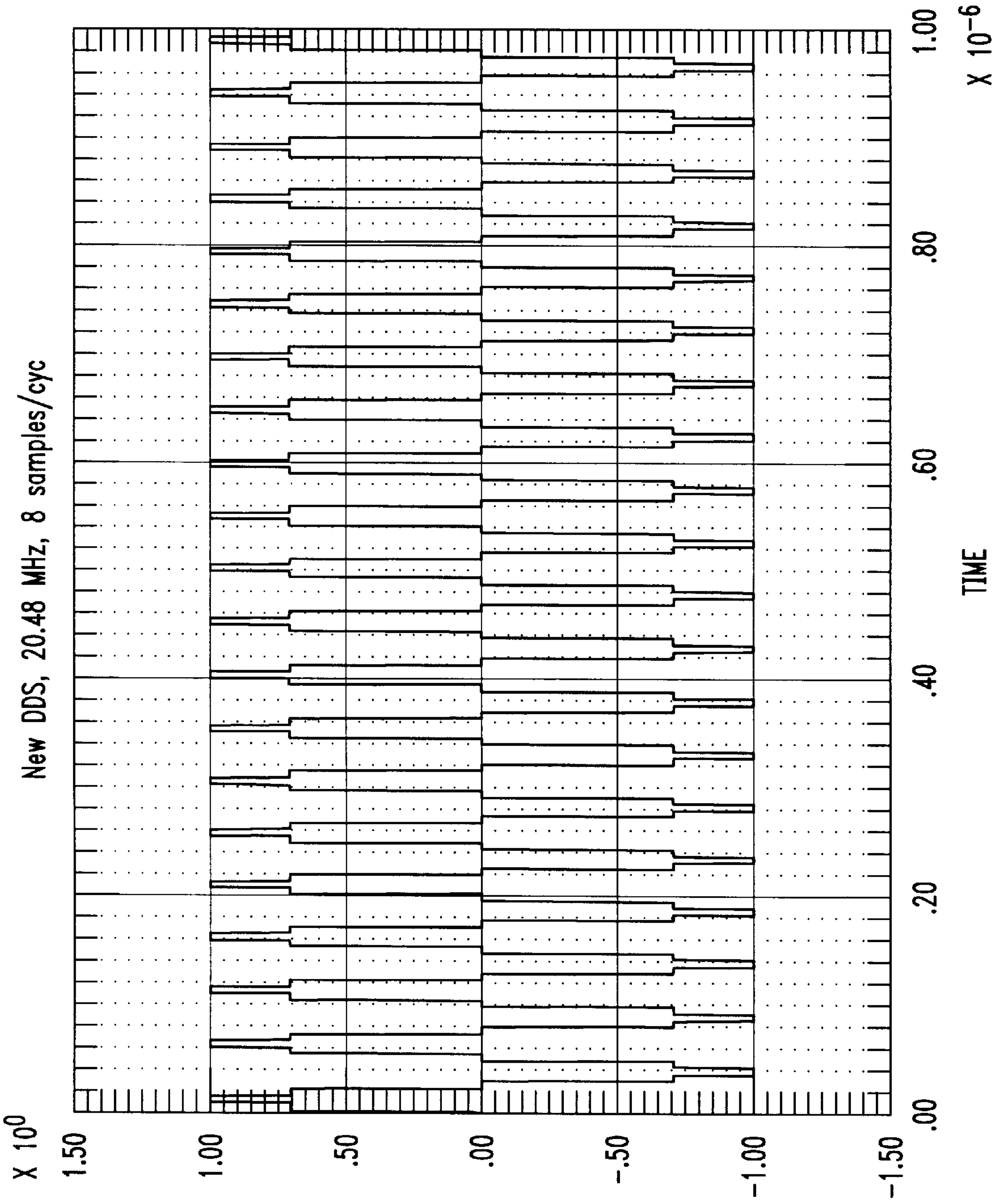
FIG. 15 shows a simulation result in the time domain at the DAC output of a direct digital synthesis system including a constant 8 samples per cycle without the need for a look-up table, in accordance with the principles of the present invention.

FIG. 12 shows a simulation result in the time domain of the DAC output of a conventional direct digital synthesis system using a high speed clock (e.g., 65.536 MHz) and a 10 bit linear digital-to-analog converter, and FIGS. 13–15 show a simulation result in the time domain of the DAC output of a direct digital synthesis system including a constant 32, 16 and 8 samples per cycle, respectively, without the need for a look-up table, in accordance with the principles of the present invention.

Figure 16:
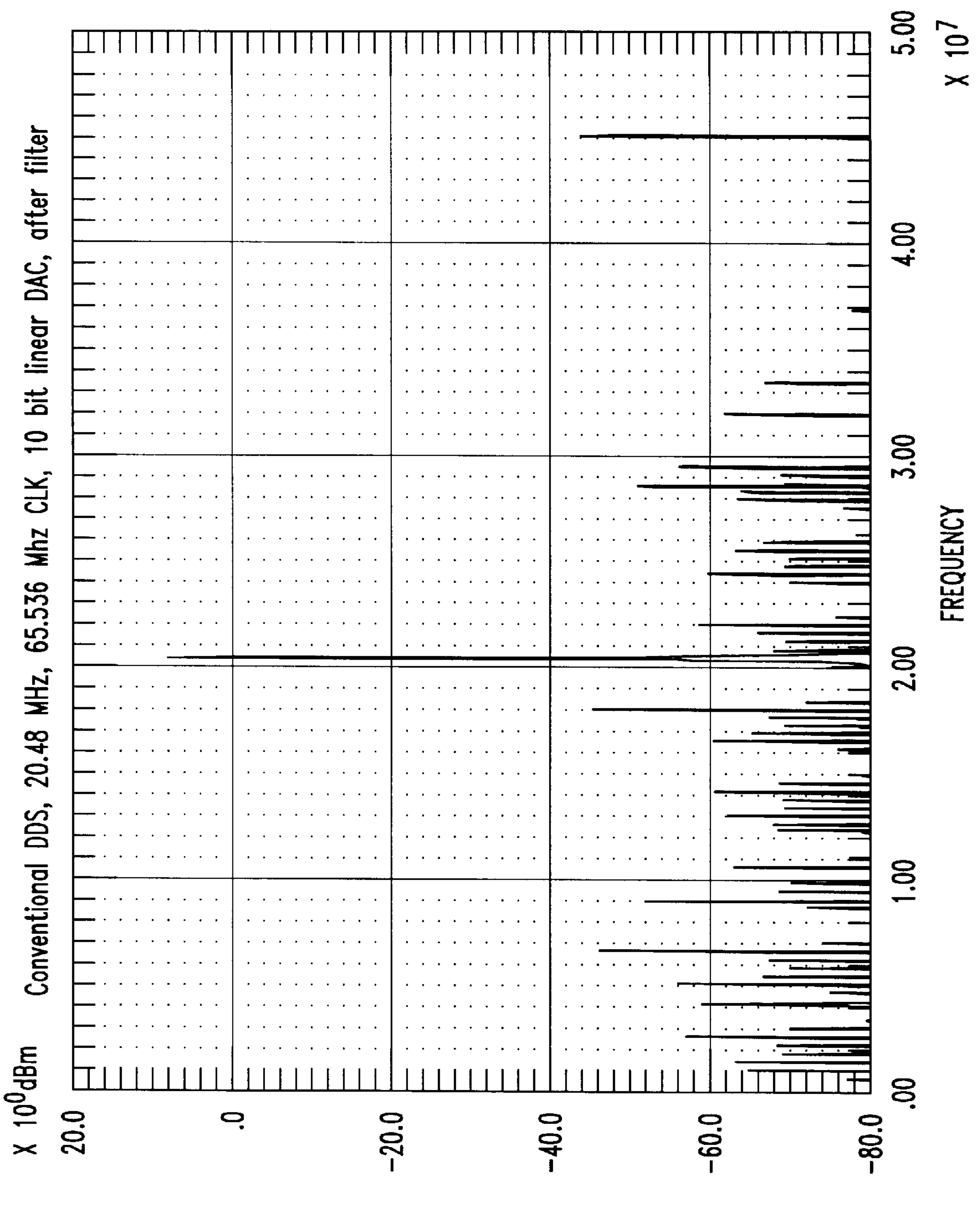
FIG. 16 PRIOR ART
FIG. 16 shows a simulation result in the frequency domain of a conventional direct digital synthesis system after a smoothing filter using a very high speed clock (e.g., 65.536 MHz) and a 10 bit linear digital-to-analog converter.
Figure 17:
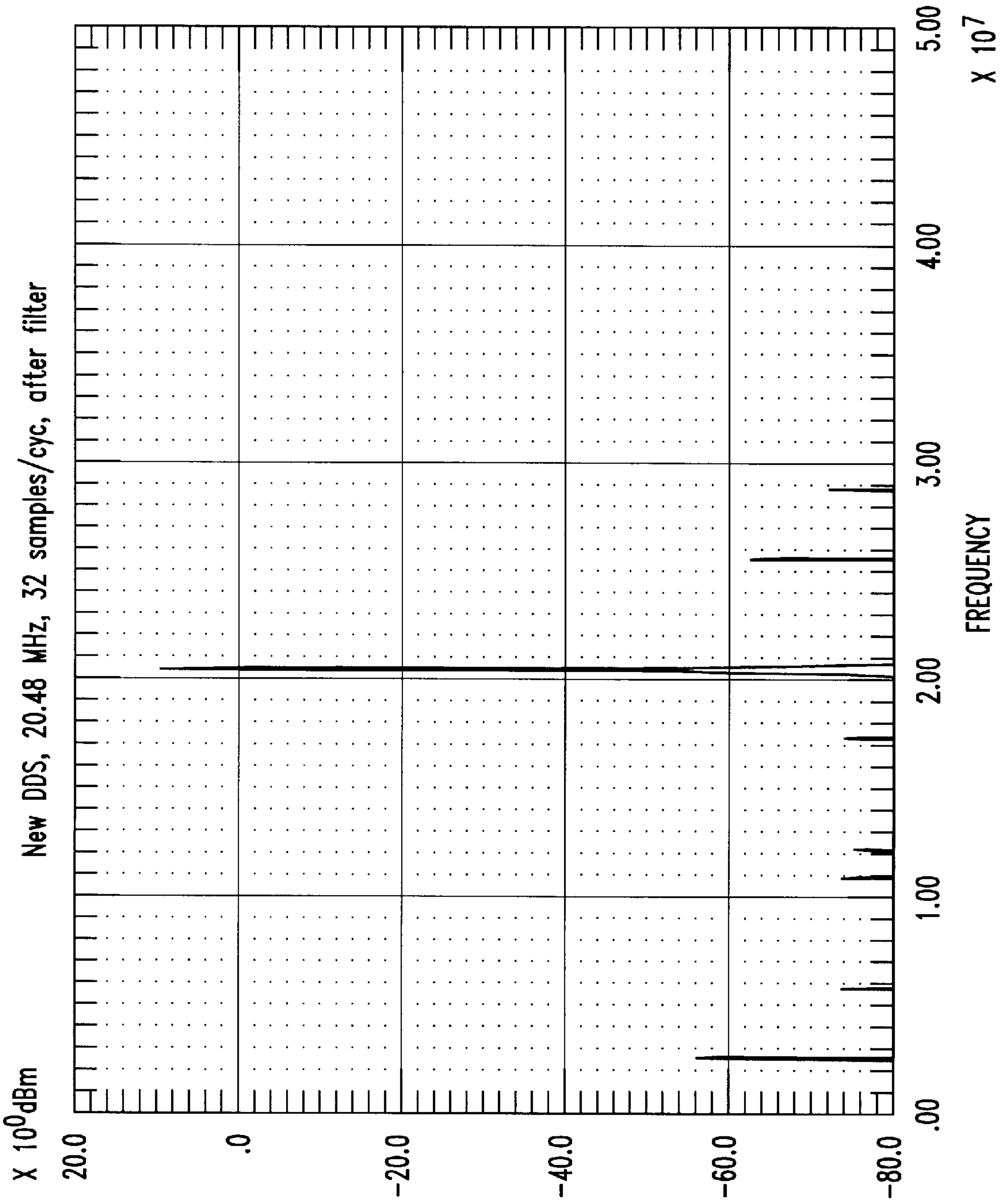
FIG. 17 shows a simulation result in the frequency domain of a direct digital synthesis system after the same smoothing filter including a constant 32 samples per cycle without the need for a look-up table, in accordance with the principles of the present invention.
Figure 18:
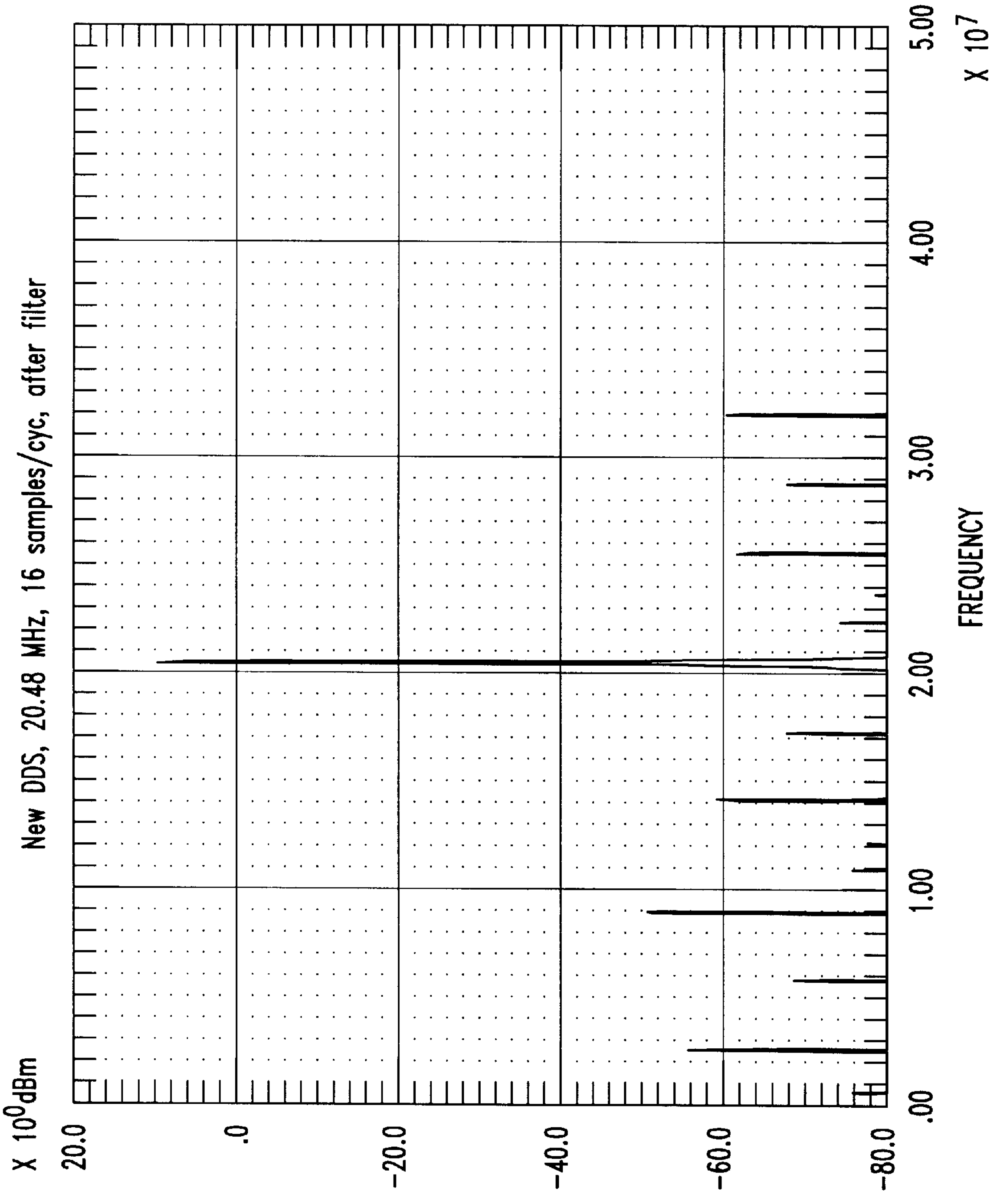
FIG. 18 shows a simulation result in the frequency domain of a direct digital synthesis system after the same smoothing filter including a constant 16 samples per cycle without the need for a look-up table, in accordance with the principles of the present invention.
Figure 19:
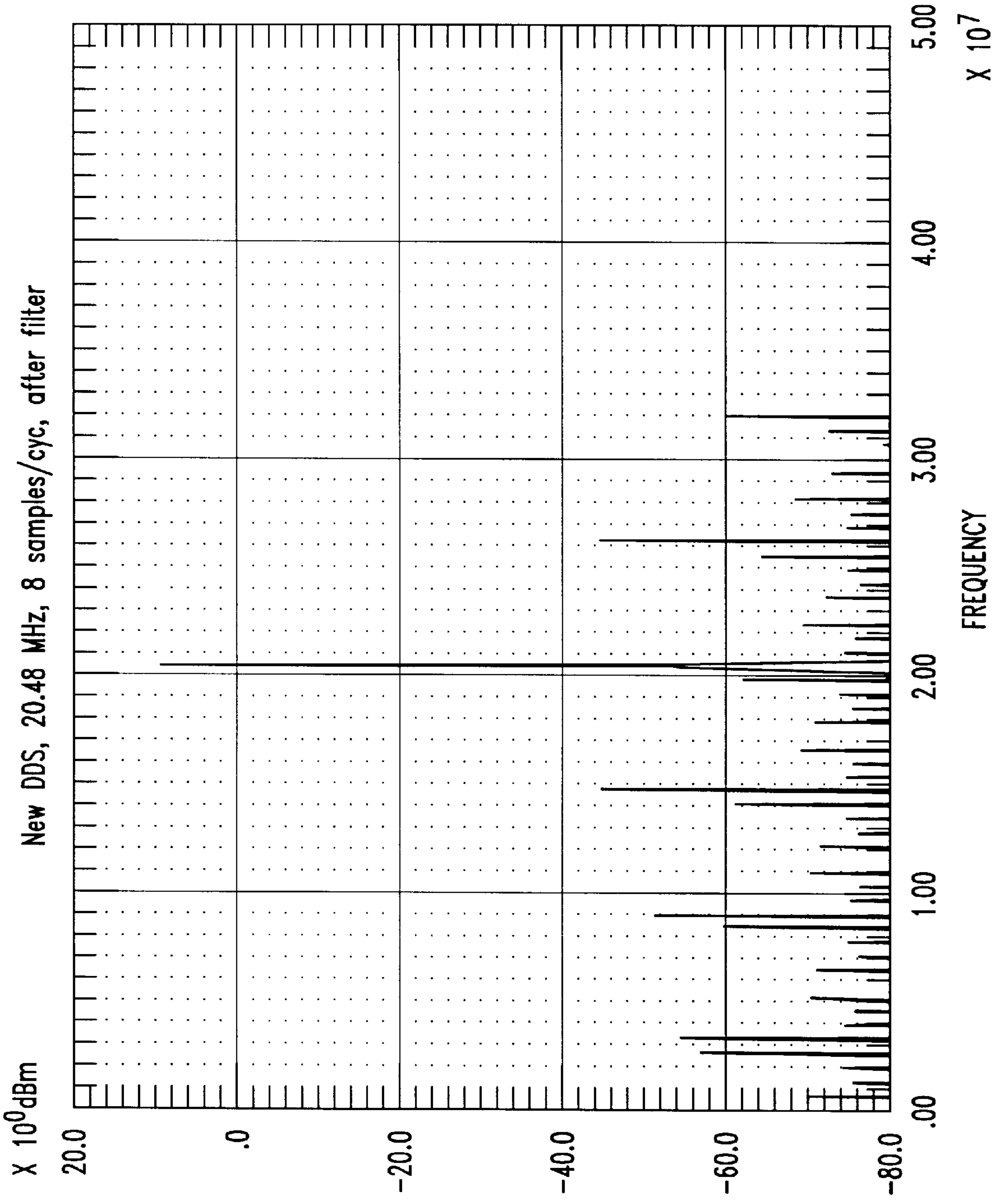
FIG. 19 shows a simulation result in the frequency domain of a direct digital synthesis system after the same smoothing filter including a constant 8 samples per cycle without the need for a look-up table, in accordance with the principles of the present invention.

Similarly, FIG. 16 shows a simulation result in the frequency domain of a conventional direct digital synthesis system after a smoothing filter using a high speed clock (e.g., 65.536 MHz) and a 10 bit linear digital-to-analog converter. FIGS. 17–19 show simulation results in the frequency domain of a direct digital synthesis system after the same smoothing filter including a constant 32, 16 and 8 samples per cycle, respectively, without the need for a look-up table, in accordance with the principles of the present invention.

The principles of the present invention are applicable to a broad range of radio communications device and system applications requiring signal waveforms of predictable form, e.g., pure sine wave form, FSK or PSK modulated carriers, etc. For instance, the principles of the present invention can be used to modulate between phase increment values in a continuous phase manner between multiple sine-wave tones (e.g., to perform binary or M-ary frequency shift keying) or to produce phase modulated signals.

While the invention has been described with reference to the exemplary embodiments thereof, those skilled in the art will be able to make various modifications to the described embodiments of the invention without departing from the true spirit and scope of the invention.

What is claimed is:

1. A direct digital synthesizer, comprising:

a numerically controlled oscillator adapted to decode to a constant number of samples per cycle of frequency output; and a sine-weighted digital-to-analog converter receiving an output from said numerically controlled oscillator.

2. The direct digital synthesizer according to claim 1, wherein:

said constant number of samples are sine-weighted.

3. The direct digital synthesizer according to claim 1, wherein said NCO comprises:

a phase accumulator;

at least one phase increment value register; and an adder adapted to add an output value from said phase accumulator to a phase increment value stored in said at least one phase increment value register.

4. The direct digital synthesizer according to claim 3, wherein said phase increment value register comprises:

at least two inputs which are alternated for use by said adder.

5. The direct digital synthesizer according to claim 1, wherein:

said numerically controlled oscillator is a 1-bit NCO.

6. The direct digital synthesizer according to claim 1, further comprising:

a reconstruction filter receiving an output signal from said digital-to-analog converter.

7. The direct digital synthesizer according to claim 6, wherein:

said reconstruction filter is a low pass filter.

8. The direct digital synthesizer according to claim 1, further comprising:

a digital divider between said numerically controlled oscillator and said digital-to-analog converter, said digital divider dividing an output from the most significant bit of said numerically controlled oscillator by said constant number of samples per frequency cycle.

9. The direct digital synthesizer according to claim 1, wherein:

said constant number of sine-weighted samples per cycle represent common points on a generated sine wave regardless of a frequency of a signal being generated by said direct digital synthesizer.

10. A method of synthesizing a sine-wave signal, comprising:

generating a numerically controlled oscillator output decoding to a constant number of samples per cycle of a desired frequency generated; and digitally converting said constant number of samples using a sine-weighted digital-to-analog converter.

11. The method of synthesizing a sine-wave signal according to claim 10, further comprising:

smoothing an output of said digital-to-analog converter.

12. The method of synthesizing a sine-wave signal according to claim 10, wherein:

said generated NCO output is 1-bit.

13. The method of synthesizing a sine-wave signal according to claim 10, further comprising:

modulating an output of said numerically controlled oscillator between a constant number of samples per cycle of a first desired frequency generated, and said same constant number of samples per cycle of a second desired frequency generated.

14. The method of synthesizing a sine-wave signal according to claim 10, further comprising:

scaling a clock signal to said numerically controlled oscillator to a point sufficient to save power while maintaining adequate oversampling for desired proper operation.

15. Apparatus for synthesizing a sine-wave signal, comprising:

means for generating a numerically controlled oscillator output having a constant number of samples per cycle of a desired frequency generated; and means for digitally converting said constant number of samples using a sine-weighted digital-to-analog converter.

16. The apparatus for synthesizing a sine-wave signal according to claim 15, further comprising:

means for smoothing an output of said digital-to-analog converter.

17. The apparatus for synthesizing a sine-wave signal according to claim 15, wherein:

said generated NCO output is 1-bit.

18. The apparatus for synthesizing a sine-wave signal according to claim 15, further comprising:

means for modulating an output of said numerically controlled oscillator between a constant number of samples per cycle of a first desired frequency generated, and said same constant number of samples per cycle of a second desired frequency generated.

19. The apparatus for synthesizing a sine-wave signal according to claim 15, further comprising:

means for scaling a clock signal to said numerically controlled oscillator to a point sufficient to save power while maintaining adequate oversampling for desired proper operation.

* * * * *